(12) United States Patent
Zhang et al.

(10) Patent No.: US 10,147,397 B2
(45) Date of Patent: Dec. 4, 2018

(54) FLEXIBLE DISPLAY PANEL AND DRIVING METHOD THEREOF, AND DISPLAY DEVICE

(71) Applicant: BOE Technology Group Co., Ltd., Beijing (CN)

(72) Inventors: Chunfang Zhang, Beijing (CN); Song Song, Beijing (CN); Kazuyoshi Nagayama, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 15/321,901

(22) PCT Filed: Jun. 12, 2016

(86) PCT No.: PCT/CN2016/085413
§ 371 (c)(1),
(2) Date: Dec. 23, 2016

(87) PCT Pub. No.: WO2016/197970
PCT Pub. Date: Dec. 15, 2016

(65) Prior Publication Data
US 2017/0148419 A1    May 25, 2017

(30) Foreign Application Priority Data
Jun. 12, 2015  (CN) .......................... 2015 1 0325101

(51) Int. Cl.
*G09G 5/32*  (2006.01)
*G09G 5/00*  (2006.01)
(Continued)

(52) U.S. Cl.
CPC .............. *G09G 5/32* (2013.01); *G09F 9/301* (2013.01); *G09G 5/003* (2013.01); *G11C 27/04* (2013.01);
(Continued)

(58) Field of Classification Search
CPC .... G09G 5/32; G09G 5/003; G09G 2330/023; G09G 2310/0286; G09G 2380/02;
(Continued)

(56) References Cited

U.S. PATENT DOCUMENTS

| 2008/0018631 A1 | 1/2008 | Hioki et al. | |
| 2015/0229844 A1* | 8/2015 | Yamazaki | H04N 5/23293 348/333.01 |
| 2016/0336523 A1* | 11/2016 | Kwon | H01L 27/3276 |

FOREIGN PATENT DOCUMENTS

| CN | 101853608 A | * 10/2010 |
| CN | 104238160 A | 12/2014 |

(Continued)

OTHER PUBLICATIONS

Dec. 29, 2016—(CN) First Office Action Appn 201510325101.0 with English Tran.
(Continued)

*Primary Examiner* — Alexander Eisen
*Assistant Examiner* — Kebede Teshome
(74) *Attorney, Agent, or Firm* — Banner & Witcoff, Ltd.

(57) ABSTRACT

A flexible display panel and a driving method thereof, and a display device are provided. The flexible display panel includes a pixel region and a gate driving circuit region located outside the pixel region. The flexible display panel further includes a curvature adjusting unit located on two sides of the pixel region, the curvature adjusting unit includes a plurality of isosceles trapezoid units which are sequentially connected with each other through lower surfaces thereof, each isosceles trapezoid unit includes an upper surface, the lower surface, and a third waist surface and a fourth waist surface oppositely arranged between the upper surface and the lower surface, and a length of the upper surface between the third waist surface and the fourth waist surface is less than a length of the lower surface between the
(Continued)

third waist surface and the fourth waist surface. In the case that the display panel is bent and in a bent portion of the display panel, the third waist surface of the isosceles trapezoid unit attaches to the fourth waist surface of the isosceles trapezoid unit adjacent thereto, and the upper surface of the isosceles trapezoid unit is connected with the upper surface of the isosceles trapezoid unit adjacent thereto.

16 Claims, 7 Drawing Sheets

(51) Int. Cl.
*G09F 9/30* (2006.01)
*G11C 27/04* (2006.01)
*H01L 27/12* (2006.01)

(52) U.S. Cl.
CPC ........ *H01L 27/124* (2013.01); *H01L 27/1218* (2013.01); *G09G 2300/0426* (2013.01); *G09G 2310/0286* (2013.01); *G09G 2330/023* (2013.01); *G09G 2380/02* (2013.01)

(58) Field of Classification Search
CPC . G09G 2300/0426; G09F 9/301; G11C 27/04; H01L 27/124; H01L 27/1218
See application file for complete search history.

(56) References Cited

FOREIGN PATENT DOCUMENTS

| | | |
|---|---|---|
| CN | 104318869 A | 1/2015 |
| CN | 104658466 A | 5/2015 |
| CN | 104851369 A | 8/2015 |
| TW | 201035934 A1 | 10/2010 |

OTHER PUBLICATIONS

Aug. 12, 2016—(WO) International Search Report and Written Opinion Appn PCT/CN2016/085413 with English Tran.

* cited by examiner

FLEXIBLE DISPLAY PANEL AND DRIVING METHOD THEREOF, AND DISPLAY DEVICE

The application is a U.S. National Phase Entry of International Application No. PCT/CN2016/085413 filed on Jun. 12, 2016, designating the United States of America and claiming priority to Chinese Patent Application No. 201510325101.0 filed on Jun. 12, 2015. The present application claims priority to and the benefit of the above-identified applications and the above-identified applications are incorporated by reference herein in their entirety.

TECHNICAL FIELD

Embodiments of the present disclosure relate to a flexible display panel and a driving method thereof, and a display device.

BACKGROUND

At present, in order to save storage space, a flexible display panel is designed to be bendable. In the case that the flexible display panel is bent for storage, a curvature radius of a bent portion of the flexible display panel is hard to be controlled and easy to be changed, which seriously affects a service life of the flexible display panel. In addition, in the case that the flexible display panel is working, the bent portion also displays normally, but a viewer does not care about the display content of the bent portion because the bent portion is bended, resulting in waste of energy consumption in the bent portion.

SUMMARY

According to embodiments of the disclosure, a flexible display panel is provided. The flexible display panel comprises: a pixel region and a gate driving circuit region located outside the pixel region. The flexible display panel further comprises a curvature adjusting unit located on two sides of the pixel region, the curvature adjusting unit comprises a plurality of isosceles trapezoid units which are sequentially connected with each other through lower surfaces thereof, each isosceles trapezoid unit includes an upper surface, the lower surface, and a third waist surface and a fourth waist surface oppositely arranged between the upper surface and the lower surface, and a length of the upper surface between the third waist surface and the fourth waist surface is less than a length of the lower surface between the third waist surface and the fourth waist surface; and in the case that the display panel is bent and in a bent portion of the display panel, the third waist surface of the isosceles trapezoid unit attaches to the fourth waist surface of the isosceles trapezoid unit adjacent thereto, and the upper surface of the isosceles trapezoid unit is connected with the upper surface of the isosceles trapezoid unit adjacent thereto.

For example, the curvature adjusting unit is arranged above the gate driving circuit region on the two sides of the pixel region, the gate driving circuit region includes a plurality of gate driving circuit sub-regions, and each gate driving circuit sub-region includes a plurality of shift register units, and each of the isosceles trapezoid units corresponds to one of the gate driving circuit sub-regions.

For example, a curvature radius R of the flexible display panel in a bent state satisfies a relationship as follows:

$$a = \frac{\theta(R-h)}{N}, b = \frac{\theta R}{N};$$

where, a is the length of the upper surface between the third waist surface and the fourth waist surface; b is the length of the lower surface between the third waist surface and the fourth waist surface; h is a height of the isosceles trapezoid unit; $\theta$ is a bending arc angle of all isosceles trapezoid units located on an inner ring in the case that the flexible display panel is in the bent state, where $0<\theta\leq 2\pi$; N is a number of all isosceles trapezoid units located on one side of the pixel region and located on the inner ring in the case that the flexible display panel is in the bent state, where $0<N\leq M$, and M is a number of all isosceles trapezoid units provided on one side of the pixel region.

For example, the isosceles trapezoid unit includes a conductive structure arranged in the isosceles trapezoid unit, a first end of the conductive structure is arranged on the third waist surface of the isosceles trapezoid unit, and a second end of the conductive structure is arranged on the fourth waist surface of the isosceles trapezoid unit, in two adjacent isosceles trapezoid units, in the case that the third waist surface of one isosceles trapezoid unit attaches to the fourth waist surface of the other isosceles trapezoid unit adjacent thereto, the first end of the conductive structure of the one isosceles trapezoid unit is electrically connected with the second end of the conductive structure of the other isosceles trapezoid unit, a third end of the conductive structure is electrically connected with a signal input end of any one of the shift register units in the gate driving circuit sub-region covered by the isosceles trapezoid unit, and at two ends or one end of the curvature adjusting unit, a shift register unit turn-off signal is input to the third end of the conductive structure of an outermost isosceles trapezoid unit in the case that the display panel is bent.

For example, a same number of shift register units are provided between the shift register units connected with the third ends of the conductive structures of any two adjacent isosceles trapezoid units.

For example, the conductive structure includes a plate-shaped conductor or a pillar-shaped conductor provided between the first end and the second end, and the third end is electrically connected with the conductor provided between the first end and the second end.

For example, the first end of the conductive structure includes a convex structure or a concave structure, and the second end of the conductive structure includes a concave structure or a convex structure, and in the case that two adjacent isosceles trapezoid units attach to each other, the convex structure of the conductive structure of one isosceles trapezoid unit engages with the concave structure of the conductive structure of the other isosceles trapezoid unit.

For example, the flexible display panel further comprises: a switching transistor located outside the pixel region. One switching transistor is arranged for each shift register unit, a drain electrode of the switching transistor is connected with the shift register unit, a source electrode of the switching transistor is connected with a reset signal line, and a gate electrode of the switching transistor is connected with a gate signal line, and one reset signal line and one gate signal line are arranged for each switching transistor.

For example, the flexible display panel further comprises: a switching transistor located outside the pixel region. One switching transistor is arranged for each shift register unit, a drain electrode of the switching transistor is connected with the shift register unit, a source electrode of the switching transistor is connected with a reset signal line, and a gate electrode of the switching transistor is connected with a gate signal line; and along a scanning direction, a last shift register unit in a previous gate driving circuit sub-region and other shift register units than a last shift register unit in a next gate driving circuit sub-region are all connected with a same reset signal line and a same gate signal line, and the scanning direction is a direction in which the plurality of shift register units are turned on sequentially at the time of displaying a frame of image.

For example, the flexible display panel further comprises: a switching transistor located outside the pixel region. The gate driving circuit region includes a plurality of shift register units, one switching transistor is arranged for each shift register unit, a drain electrode of the switching transistor is connected with the shift register unit, a source electrode of the switching transistor is connected with a reset signal line, and a gate electrode of the switching transistor is connected with a gate signal line; and one reset signal line and one gate signal line are arranged for one switching transistor.

According to the embodiments of the disclosure, a driving method of the flexible display panel as described above is provided. The method comprises: turning off the shift register units in the gate driving circuit sub-region in the case that the gate driving circuit sub-region is located in the bent portion of the display panel; and turning on the shift register units in the gate driving circuit sub-region in the case that the gate driving circuit sub-region is located in a flat portion of the display panel.

For example, the method comprises: at two ends or one end of the curvature adjusting unit, inputting a shift register unit turn-off signal to the third end of the conductive structure of an outermost isosceles trapezoid unit in the case that the display panel is bent.

For example, the method comprises: in the case that the gate driving circuit sub-region is located in the bent portion, inputting a turn-on signal to the switching transistors corresponding to the shift register units in the gate driving circuit sub-region by the gate signal lines, and inputting a reset signal transmitted on the reset signal lines to the shift register units by the switching transistors, so as to turn off the shift register units; and in the case that the gate driving circuit sub-region is located in the flat portion, inputting a turn-off signal to the switching transistors corresponding to the shift register units in the gate driving circuit sub-region by the gate signal lines, and being not able to input the reset signal transmitted on the reset signal lines to the shift register units, so that the shift register units work normally.

According to embodiments of the disclosure, a display device is provided. The display device comprises the flexible display panel as described above.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those ordinarily skilled in the art can obtain other embodiment(s), without any inventive work, which should be within the scope of the present disclosure.

Figure 1:
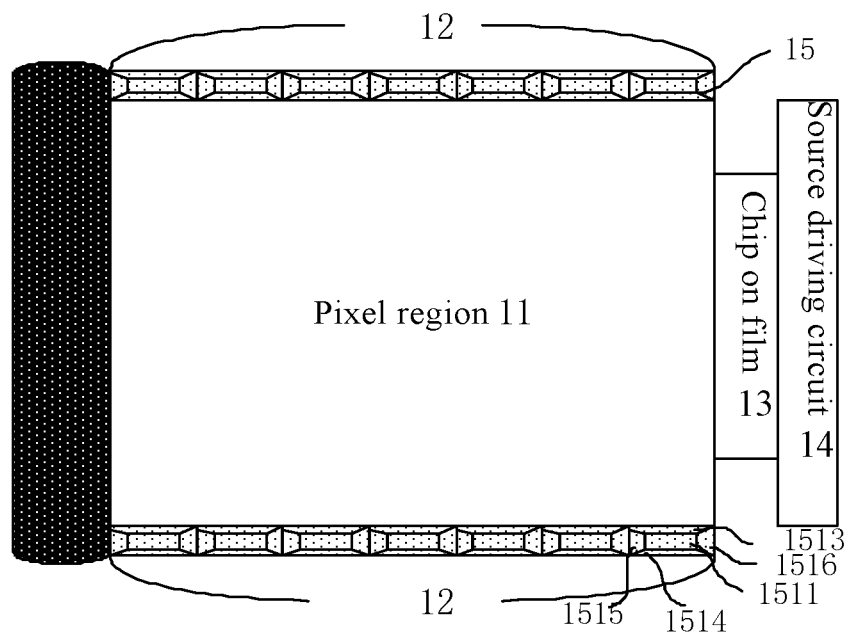
FIG. 1 is a structural schematic view of a flexible display panel provided by embodiments of the present disclosure.

Referring to FIG. 1, embodiments of the present disclosure provide a flexible display panel, comprising: a pixel region 11, a gate driving circuit region 12, and a source driving circuit 14 connected with the pixel region 11 for example through a chip on film 13. The flexible display panel according to the embodiments of the present disclosure further comprises a curvature adjusting unit 15 located on two sides of the pixel region 11, the curvature adjusting unit 15 comprises a plurality of isosceles trapezoid units 151 which are sequentially connected with each other through lower surfaces thereof, each isosceles trapezoid unit 151 includes an upper surface 1511, the lower surface 1512, a first waist surface 1513 and a second waist surface 1514 oppositely arranged between the upper surface 1511 and the lower surface 1512, and a third waist surface 1515 and a fourth waist surface 1516 oppositely arranged between the upper surface 1511 and the lower surface 1512, and a length of the upper surface 1511 between the third waist surface 1515 and the fourth waist surface 1516 is less than a length of the lower surface 1512 between the third waist surface 1515 and the fourth waist surface 1516. In the case that the display panel is bent, the third waist surface 1515 of the isosceles trapezoid unit attaches to the fourth waist surface 1516 of the isosceles trapezoid unit adjacent thereto, and the upper surface 1511 of the isosceles trapezoid unit is connected with the upper surface 1511 of the isosceles trapezoid unit adjacent thereto.

For example, as shown in FIG. 1, the curvature adjusting unit 15 is located outside the pixel region 11 and the curvature adjusting unit 15 is arranged on two opposite sides of the pixel region 11, and edges provided on the two opposite sides of the flexible display panel are bent in the case that the flexible display panel is bent.

The flexible display panel according to the embodiments of the present disclosure is provided with the curvature adjusting unit, and the curvature adjusting unit comprises the plurality of isosceles trapezoid units which are sequentially connected with each other through lower surfaces thereof. Since a structure of the isosceles trapezoid unit is stable, a curvature radius the flexible display panel is fixed in the case that the flexible display panel is bent, so that the control of the curvature radius of the flexible display panel is achieved in the case that the flexible display panel is bent. Further, since the radius curvature of the flexible display panel is fixed in the case that the flexible display panel is bent, the flexible display panel is bent at a same curvature radius in each bending, so that the flexible display panel is prevented from being bent at a different curvature radius in each bending, and a service life of the flexible display panel is elongated.

As shown in FIG. 1, for example, the curvature adjusting unit 15 is arranged above the gate driving circuit region 12 on the two sides of the pixel region 11, the gate driving circuit region 12 includes a plurality of gate driving circuit sub-regions, and for example, each isosceles trapezoid unit corresponds to one gate driving circuit sub-region. The gate driving circuit region 12 is a non-display region of the flexible display panel, degree of integration of the display panel is improved by arranging the curvature adjusting unit 15 directly above the gate driving circuit regions 12 on two sides of the pixel region 11, which is conducive to narrowing a frame of the flexible display panel.

Figure 2A:
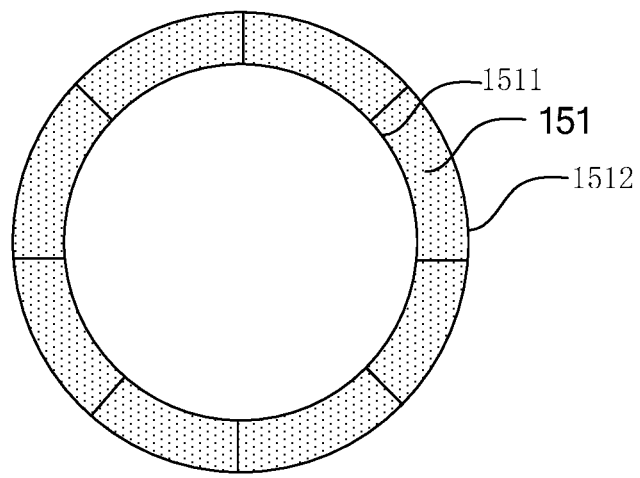
FIG. 2a is a cross-sectional structural schematic view of the flexible display panel provided by the embodiments of the present disclosure in a bent state.
Figure 2B:
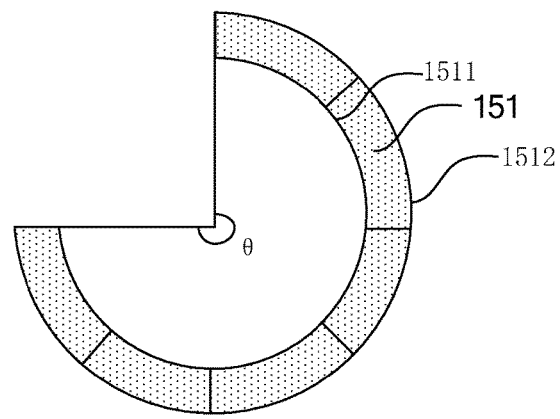
FIG. 2b is a cross-sectional structural schematic view of the flexible display panel provided by the embodiments of the present disclosure in another bent state.

For example, the curvature radius R of the flexible display panel in a bent state satisfies a relationship as follows:

$$a = \frac{\theta(R-h)}{N}, b = \frac{\theta R}{N};$$

where, a is the length of the upper surface between the third waist surface and the fourth waist surface; b is the length of the lower surface between the third waist surface and the fourth waist surface; h is a height of the isosceles trapezoid unit; $\theta$ is a bending arc angle of all isosceles trapezoid units located on an inner ring in the case that the flexible display panel is in the bent state, where $0<\theta\leq 2\pi$; N is a number of all isosceles trapezoid units located on one side of the pixel region and located on the inner ring in the case that the flexible display panel is in the bent state, where $0<N\leq M$, and M is a number of all isosceles trapezoid units provided on one side of the pixel region. Exemplarily, as shown in FIG. 2a, in the case that the flexible display panel is in the bent state, a cross section of the inner ring is approximate to a circle (of course, the flexible display panel may be bent by one circle or more than one circle), and at this time, the bending arc angle of all isosceles trapezoid units located on the inner ring in the case that the flexible display panel is in the bent state is that, $\theta = 2\pi$. It should be noted that, FIG. 2a only shows the inner ring in the case that the flexible display panel is in the bent state, and does not show other portions than the inner ring of the flexible display panel. Exemplarily, as shown in FIG. 2b, a cross section of the inner ring in the case that the flexible display panel is in the bent state is a circular arc, and at this time, the bending arc angle of all isosceles trapezoid units located on the inner ring in the case that the flexible display panel is in the bent state is that, $\theta<2\pi$.

Figure 3:
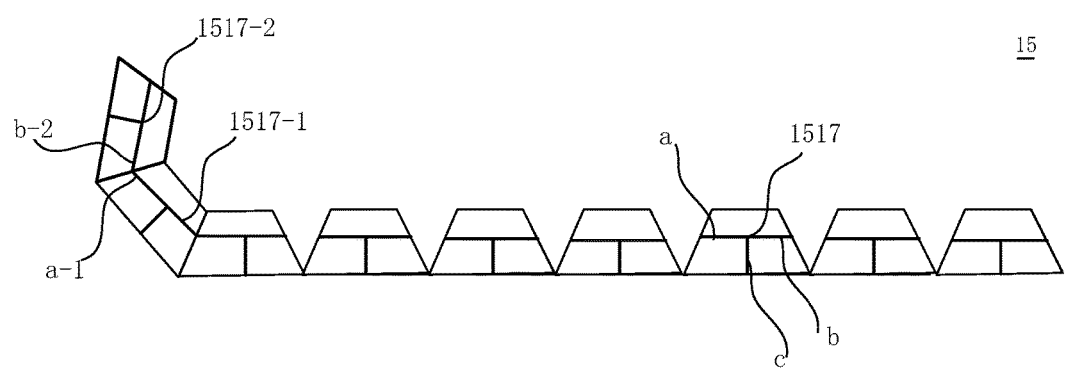
FIG. 3 is a structural schematic view of a curvature adjusting unit provided by the embodiments of the present disclosure.

Further, referring to FIG. 3, the isosceles trapezoid unit 151 includes a conductive structure 1517 arranged in the isosceles trapezoid unit, a first end a of the conductive structure 1517 is arranged on the third waist surface 1515 of the isosceles trapezoid unit 151, and a second end b of the conductive structure 1517 is arranged on the fourth waist surface 1516 of the isosceles trapezoid unit 151. In two adjacent isosceles trapezoid units, in the case that the third waist surface of one isosceles trapezoid unit attaches to the fourth waist surface of the other isosceles trapezoid unit adjacent thereto, the first end a-1 of the conductive structure 1517-1 of the one isosceles trapezoid unit is electrically connected with the second end b-2 of the conductive structure 1517-2 of the other isosceles trapezoid unit.

For example, a third end c of the conductive structure 1517 is electrically connected with a signal input end of any one of shift register units in the gate driving circuit sub-region covered by the isosceles trapezoid unit.

For example, at two ends or one end of the curvature adjusting unit 15, a shift register unit turn-off signal is input to the third end of the conductive structure of an outermost isosceles trapezoid unit in the case that the display panel is bent, and thus a portion of the pixel region corresponding to the bent portion does not work in the case that the display panel is bent and an arrangement of wires is simplified. For example, in FIG. 1, the end of the flexible display panel provided with the source driving circuit 14 is inconvenient to be bent, and thus the end of the flexible display panel opposite to the end provided with the source driving circuit 14 is bent; and in this case, at the end of the flexible display panel opposite to the end provided with the source driving circuit 14, the shift register unit turn-off signal is input by the third end of the conductive structure of the outermost isosceles trapezoid unit.

For example, a same number of shift register units are provided between the shift register units connected with the third ends of the conductive structures of any two adjacent isosceles trapezoid units.

Figure 4:
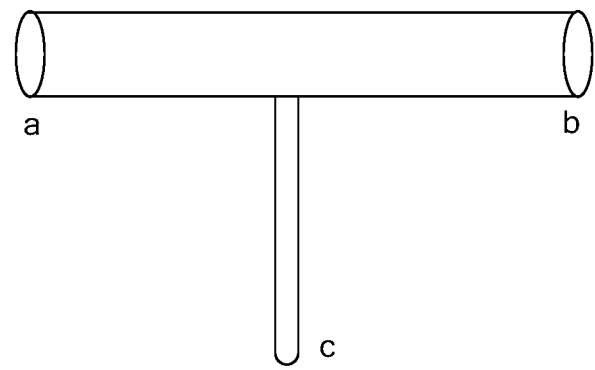
FIG. 4 is a structural schematic view of a conductive structure provided by the embodiments of the present disclosure.
Figure 5:
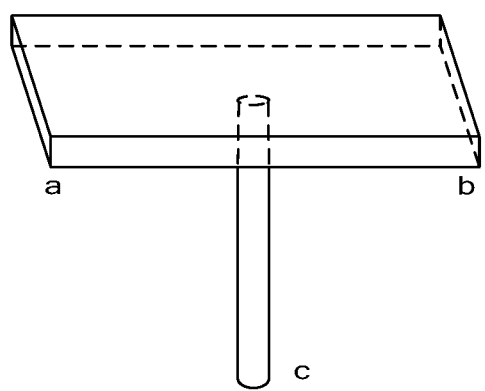
FIG. 5 is a structural schematic view of another conductive structure provided by the embodiments of the present disclosure.
Figure 6:
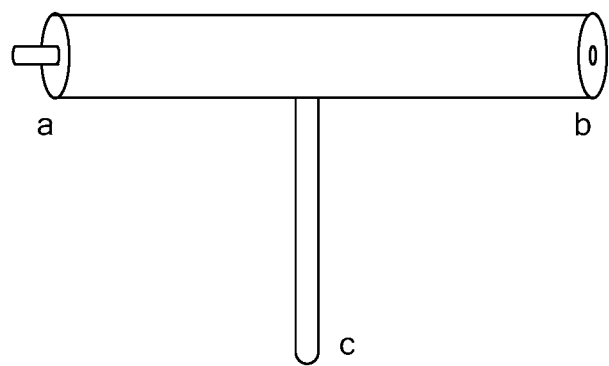
FIG. 6 is a structural schematic view of yet another conductive structure provided by the embodiments of the present disclosure.
Figure 7:
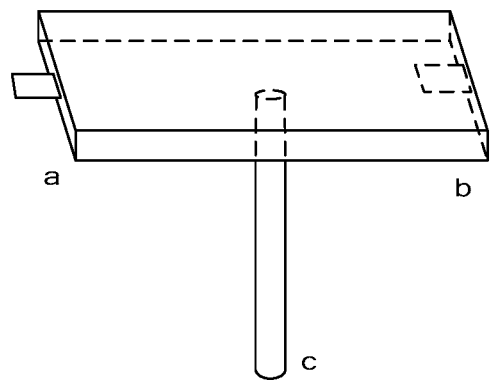
FIG. 7 is a structural schematic view of still another conductive structure provided by the embodiments of the present disclosure.

For example, the conductive structure 1517 includes a plate-shaped conductor (as shown in FIG. 5) or a pillar-shaped conductor (as shown in FIG. 4) provided between the first end and the second end, and the third end is electrically connected with the conductor between the first end and the second end. Further, in order to achieve stability of electrical connection of conductive structures of two adjacent isosceles trapezoid units, referring to FIGS. 6 and 7, the first end a of the conductive structure 1517 includes a convex structure or a concave structure, and the second end b of the conductive structure 1517 includes a concave structure or a convex structure. In the case that two adjacent isosceles trapezoid units attach to each other, the convex structure of the conductive structure of one isosceles trapezoid unit engages with the concave structure of the conductive structure of the other isosceles trapezoid unit.

For example, referring to FIG. 3, the gate driving circuit region is divided into N gate driving circuit sub-regions by N isosceles trapezoid units. For example, the display panel is a display panel having a resolution of 1920*1080 (in this case, a number of the gate driving circuits is 1080), in the case that a number of the trapezoid unit is that N=9, the gate driving circuit region is equally divided into 9 gate driving circuit sub-regions (more specifically, shift register units G1 to G120 correspond to a first sub-region, shift register units G121 to G240 correspond to a second sub-region, shift register units G241 to G360 correspond to a third sub-region, shift register units G361 to G480 correspond to a fourth sub-region, shift register units G481 to G600 correspond to a fifth sub-region, shift register units G601 to G720 correspond to a sixth sub-region, shift register units G721 to G840 correspond to a seventh sub-region, shift register units G841 to G960 correspond to an eighth sub-region, and shift register units G961 to G1080 correspond to a ninth sub-region). For example, the third end c of the conductive structure 1517 of the isosceles trapezoid unit is electrically connected with the signal input end of the shift register unit corresponding to a first gate line of the gate driving circuit sub-region. For example, in the first gate driving circuit sub-region, the third end c of the conductive structure 1517 is connected with the signal input end of the shift register unit G1; in the second gate driving circuit sub-region, the third end c of the conductive structure 1517 is connected with the signal input end of the shift register unit G121; in the third gate driving circuit sub-region, the third end c of the conductive structure 1517 is connected with the signal input end of the shift register unit G241; in the fourth gate driving circuit sub-region, the third end c of the conductive structure 1517 is connected with the signal input end of the shift register unit G361; in the fifth gate driving circuit sub-region, the third end c of the conductive structure 1517 is connected with the signal input end of the shift register unit G481; in the sixth gate driving circuit sub-region, the third end c of the conductive structure 1517 is connected with the signal input end of the shift register unit G601; in the seventh gate driving circuit sub-region, the third end c of the conductive structure 1517 is connected with the signal input end of the shift register unit G721; in the eighth gate driving circuit sub-region, the third end c of the conductive structure 1517 is connected with the signal input end of the shift register unit G841; and in the ninth gate driving circuit sub-region, the third end c of the conductive structure 1517 is connected with the signal input end of the shift register unit G961.

In the case that the flexible display panel is in a flat state, only the lower surfaces of the isosceles trapezoid units are connected with each other, and the inner conductive structures 1517 of the isosceles trapezoid units are not connected with each other. In the case that the panel is bent, the waist surfaces of two adjacent isosceles trapezoid units in the bent portion attach to each other, so that the conductive structures 1517 in the bent portion are sequentially connected through the first ends a and the second ends b (as shown in FIG. 3). As described above, at two ends or one end of the curvature adjusting unit 15, the shift register unit turn-off signal (e.g., the turn-off signal is a low level voltage Vgl) is input into the third end of the conductive structure of the outermost isosceles trapezoid unit in the case the display panel is bent, so that the third ends of conductive structures 1517 of isosceles trapezoid units in the bent portion are all input the shift register unit turn-off signal; the third ends of the conductive structures 1517 are respectively connected with the signal input ends of the shift register units, so that the shift register units in the bent portion are all input the shift register unit turn-off signal, the shift register units in the bent portion do not output the gate line driving signal, and the portion of the pixel region corresponding to the bent portion does not display, thereby greatly reducing power consumption of the panel in the case that the display panel in the bent state displays.

For example, at the time of displaying a frame of image, shift register units of a gate driving circuit provided in the gate driving circuit region are sequentially turned on in a scanning direction, and a turn-on signal is input to a next shift register unit from a previous shift register unit, so as to turn on the next shift register unit; at the end of displaying the frame of image, the shift register units of the gate driving circuit are sequentially turned off in a sequence reverse to the scanning direction, and a turn-off signal is input to the previous shift register unit from the next shift register unit, so as to turn off the previous shift register unit. For example, for the display panel having the resolution of 1920*1080 (in this case, a number of the gate driving circuits is 1080), at the time of displaying the frame of image, the shift register units are sequentially turned on by a scanning sequence from G1 to G1080, and the turn-on signal is input to the next shift register unit (e.g., G241) from the previous shift register unit (e.g., G240), so as to turn on the next shift register unit; at the end of displaying the frame of image, the shift register units are sequentially turned off by a sequence from G1080 to G1, and the turn-off signal is input to the previous shift register unit (e.g., G240) from the next shift register unit (e.g., G241), so as to turn off the previous shift register unit (e.g., G240).

Figure 8:
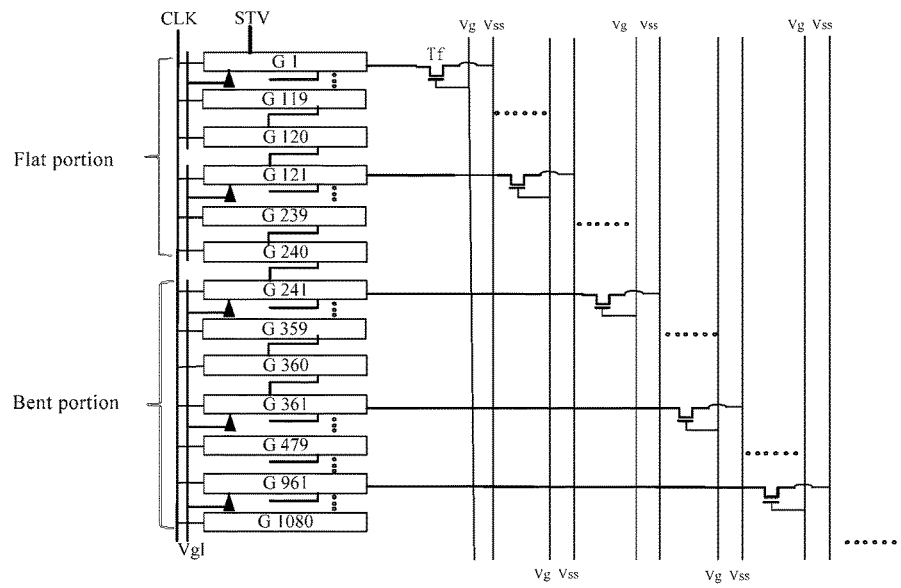
FIG. 8 is a circuit structural schematic view of the flexible display panel provided by the embodiments of the present disclosure.

Referring to FIG. 3 and FIG. 8, by the conductive structure 1517, the shift register units of the bent portion are all input the shift register unit turn-off signal Vgl, so that the shift register units of the bent portion are all turned off. Since the shift register units of the bent portion are all turned off, even if the shift register unit (e.g., G240) located in a flat portion and adjacent to the bent portion inputs the turn-on signal to the shift register unit (e.g., G241) located in the bent portion and adjacent to the flat portion at the time of displaying the frame of image, the shift register unit (e.g., G241) located in the bent portion and adjacent to the flat portion cannot be turned on. Thus, at the time of displaying the frame of image, the shift register units (e.g., G241 to G1080) of the bent portion do not participate in display, so that power consumption is reduced.

Referring to FIG. 8, since the shift register units of the bent portion are all turned off, the shift register unit (e.g., G241) located in the bent portion and adjacent to the flat portion cannot input the turn-off signal to the shift register unit (e.g., G240) located in the flat portion and adjacent to the bent portion at the end of displaying the frame of image, so that the shift register unit (e.g., G240) located in the flat portion and adjacent to the bent portion is in a discharging state. In order to solve the problem, the flexible display panel according to the embodiments of the present disclosure further comprises a switching transistor Tf located outside the pixel region 11.

Referring to FIG. 8, one switching transistor Tf is provided for each shift register unit; a drain electrode of the switching transistor Tf is connected with the shift register unit, a source electrode of the switching transistor Tf is connected with a reset signal line Vss, and a gate electrode of the switching transistor Tf is connected with a gate signal line Vg. In the case that the gate signal line Vg inputs an turn-on signal to the gate electrode of the switching transistor Tf, the switching transistor Tf is turned on, and a reset signal transmitted on the reset signal line Vss is input to the shift register unit through the switching transistor Tf, so as to turn off the shift register unit. By providing the switching transistor Tf, the shift register unit (e.g., G241) located in the flat portion and adjacent to the bent portion is turned off timely at the end of displaying the frame of image, so as to prevent the shift register unit from being discharged at all times.

Figure 9:
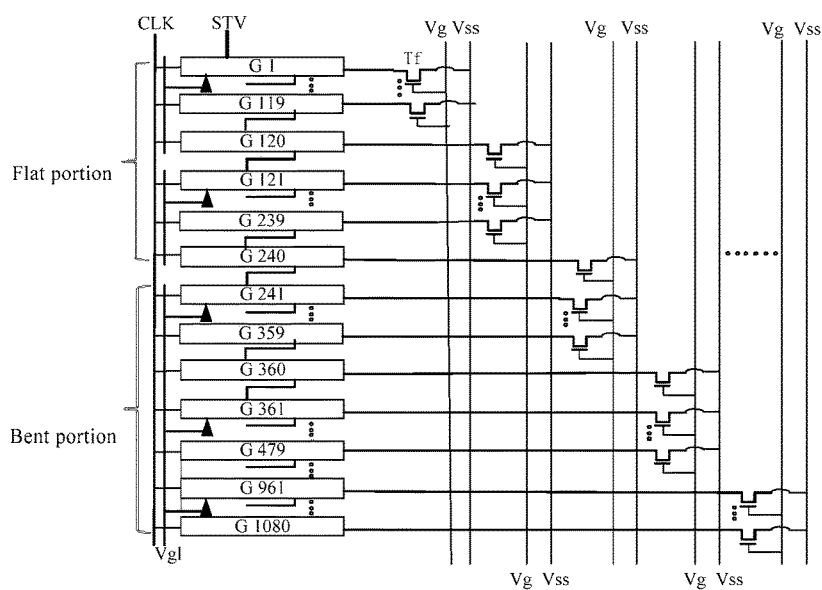
FIG. 9 is another circuit structural schematic view of the flexible display panel provided by the embodiments of the present disclosure.

In FIG. 8, one reset signal line Vss and one gate signal line Vg are provided for each switching transistor Tf. In order to simplify arrangement of wires, the flexible display panel according to the embodiments of the present disclosure for example adopts a circuit structure shown in FIG. 9. As shown in FIG. 9, the gate driving circuit region is divided into N gate driving circuit sub-regions by N isosceles trapezoid units; and along a scanning direction, a last shift register unit in a previous gate driving circuit sub-region and other shift register units than a last shift register unit in a next gate driving circuit sub-region are all connected with a same reset signal line Vss and a same gate signal line Vg. For example, a last shift register unit G240 in a second gate driving circuit sub-region and other shift register units G241 to G359 than a last shift register unit G360 in a third gate driving circuit sub-region are all connected with a same reset signal line Vss and a same gate signal line Vg. In this way, the shift register unit (e.g., G240) located in the flat portion and adjacent to the bent portion is turned off timely at the end of displaying the frame of image, so as to prevent the shift register unit from being discharged at all times; and meanwhile, the arrangement of wires is simplified.

Figure 10:
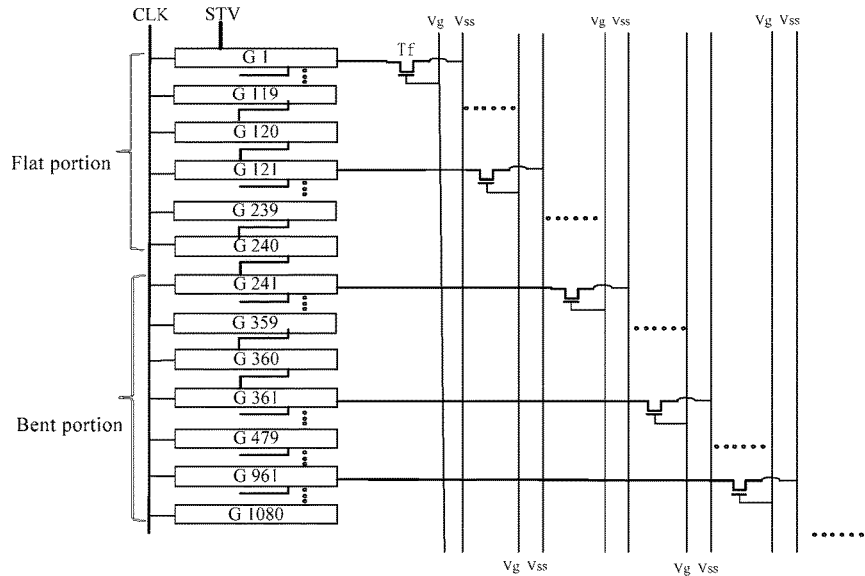
FIG. 10 is yet another circuit structural schematic view of the flexible display panel provided by the embodiments of the present disclosure.

In FIG. 8 and FIG. 9, the shift register units of the bent portion are input the shift register unit turn-off signal Vgl by the conductive structures 1517, so that the shift register units of the bent portion are all turned off. In some embodiments, the flexible display panel according to the embodiments of the present disclosure for example employs other methods to turn off the shift register units of the bent portion. As shown in FIG. 10, one switching transistor Tf is provided for each shift register unit; the drain electrode of the switching transistor Tf is connected with the shift register unit, the source electrode of the switching transistor Tf is connected with the reset signal line Vss, the gate electrode of the switching transistor Tf is connected with the gate signal line Vg, and one reset signal line Vss and one gate signal line Vg are provided for each switching transistor Tf. In the case that the gate driving circuit sub-region is located in the bent portion, the turn-on signal is input to the switching transistors Tf corresponding to the shift register units in the gate driving circuit sub-region by the gate signal lines Vg, and the reset signal transmitted on the reset signal lines Vss is input to the shift register units through the switching transistor Tf, so as to turn off the shift register units. In the case that the gate driving circuit sub-region is located in the flat portion, the turn-off signal is input to the switching transistors Tf corresponding to the shift register units in the gate driving circuit sub-region by the gate signal lines Vg, and the reset signal transmitted on the reset signal lines is not input to the shift register units, so that the shift register units work normally. It should be noted that, in the case that the circuit structure of FIG. 10 is adopted, the shift register unit (e.g., G241) located in the flat portion and adjacent to the bent portion is turned off timely at the end of displaying the frame of image by the switching transistor Tf connected thereto, so as to prevent the shift register unit (e.g., G241) located in the flat portion and adjacent to the bent portion from being discharged at all times.

It should be noted that, a clock signal (CLK) and a Start Vertical (STV) of the shift register units are also shown in FIG. 8 to FIG. 10.

Figure 12:
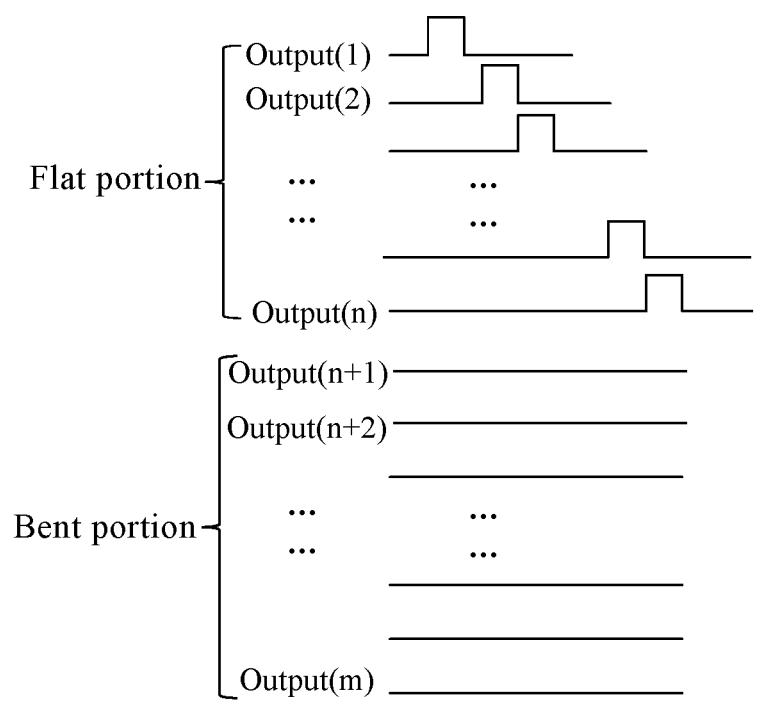
FIG. 12 is a timing schematic view of gate driving signals output by a gate driving circuit of the flexible display panel shown in FIG. 8 provided by the embodiments of the present disclosure.

FIG. 12 is a signal timing schematic view of the shift register units in the gate driving circuit in the case that the flexible display panel is bent. As shown in FIG. 12, the shift register units of the flat portion output gate driving signals OUTPUT (1) to OUTPUT (n), so as to perform normal display; and the shift register units of the bent portion are turned off, so as not to output the gate driving signals.

It should be noted that, the signal for turning off the shift register units of the bent portion for example is a low level signal.

It should be noted that, the flexible display panel according to the embodiments of the present disclosure further comprises a gate line and a data line (not shown); the gate line is connected with the shift register unit in the gate driving circuit and extends to the pixel region 11, and the data line is connected with the source driving circuit and extends to the pixel region 11. The gate line and the switching transistor Tf described above are connected with the shift register unit in the gate driving circuit in parallel.

It should be noted that, the circuit structures shown in FIGS. 8 to 10 are located outside the pixel region 11.

Figure 11:
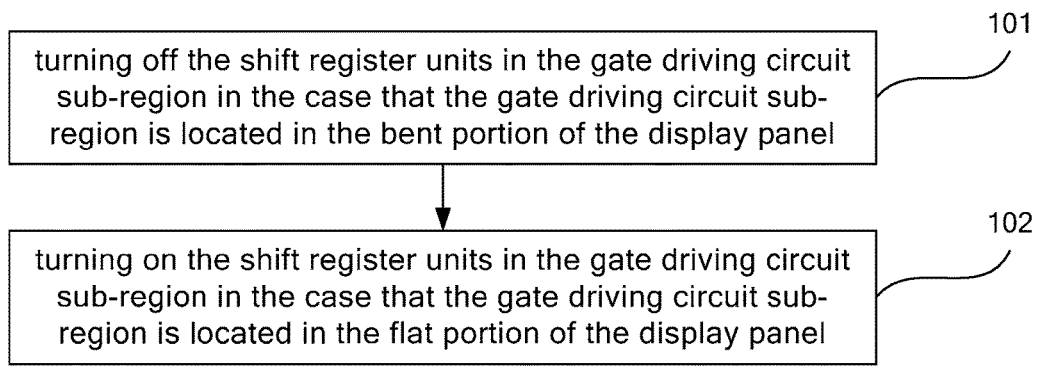
FIG. 11 is a flow schematic view of a driving method of a flexible display panel provided by the embodiments of the present disclosure.

The embodiments of the present disclosure provide a driving method of a flexible display panel, which is applied to the flexible display panel provided by the above embodiments. Referring to FIG. 11, the driving method comprises:

101: turning off the shift register units in the gate driving circuit sub-region in the case that the gate driving circuit sub-region is located in the bent portion of the display panel.

102: turning on the shift register units in the gate driving circuit sub-region in the case that the gate driving circuit sub-region is located in the flat portion of the display panel.

In the driving method of the flexible display panel provided by the embodiments of the present disclosure, in the case that the gate driving circuit sub-region is located in the bent portion of the display panel, each shift register unit in the gate driving circuit sub-region is turned off, so that a display function of the bent region is turned off, and power consumption is reduced.

Referring to the circuit schematic view of the flexible display panel shown in FIG. 8, the driving method of the flexible display panel provided by the embodiments of the present disclosure comprises: at two ends or one end of the curvature adjusting unit, inputting the shift register unit turn-off signal to the third end of the conductive structure of the outermost isosceles trapezoid unit. In the case that the panel is bent, waist surfaces of two adjacent isosceles trapezoid units in the bent portion attach to each other, so that the conductive structures 1517 of the bent portion are sequentially connected through the first ends a and the second ends b of the conductive structures, and third ends of the conductive structures 1517 of isosceles trapezoid units in the bent portion are all input the shift register unit turn-off signal; the third ends of the conductive structures 1517 are respectively connected with the signal input ends of the shift register units, so that the shift register units of the bent portion are all input the shift register unit turn-off signal, the shift register units of the bent portion do not output the gate line driving signal, and the portion of the pixel region corresponding to the bent portion does not work, thereby greatly reducing power consumption of the panel in the case that the display panel in the bent state displays.

Referring to the circuit schematic view of the flexible display panel shown in FIG. 10, the driving method of the flexible display panel provided by the embodiments of the present disclosure comprises:

201: in the case that the gate driving circuit sub-region is located in the bent portion, inputting the turn-on signal to the switching transistors Tf corresponding to the shift register units in the gate driving circuit sub-region by the gate signal lines Vg, and inputting the reset signal transmitted on the reset signal lines Vss to the shift register units by the switching transistors Tf, so as to turn off the shift register units.

202: in the case that the gate driving circuit sub-region is located in the flat portion, inputting the turn-off signal to the switching transistors Tf corresponding to the shift register units in the gate driving circuit sub-region by the gate signal lines Vg, and being not able to input the reset signal transmitted on the reset signal lines to the shift register units, so that the shift register units work normally.

The embodiments of the present disclosure provide a display device, comprising any flexible display panel described above. The display device for example is an E-paper, a mobile phone, a television, a digital photo frame and so on.

In the display device provided by the embodiments of the present disclosure, the flexible display panel is provided with the curvature adjusting unit, and the curvature adjusting unit comprises the plurality of isosceles trapezoid units which are sequentially connected with each other through lower surfaces thereof. Since a structure of the isosceles trapezoid unit is stable, the curvature radius the flexible display panel is fixed in the case that the flexible display panel is bent, so that the control of the curvature radius of the flexible display panel is achieved in the case that the flexible display panel is bent. Further, in the case that the gate driving circuit sub-region is located in the bent portion of display panel, the signal output end of each shift register unit in the gate driving circuit sub-region is turned off, so as to turn off the display function of the bent region, and thus power consumption is reduced.

The foregoing embodiments merely are exemplary embodiments of the present disclosure, and not intended to define the scope of the present disclosure, and the scope of the present disclosure is determined by the appended claims.

The present application claims priority of Chinese Patent Application No. 201510325101.0 filed on Jun. 12, 2015, the present disclosure of which is incorporated herein by reference in its entirety as part of the present application.

The invention claimed is:

1. A flexible display panel, comprising: a pixel region and a gate driving circuit region located outside the pixel region, wherein,
the flexible display panel further comprises a curvature adjuster located on two sides of the pixel region, the curvature adjuster comprises a plurality of isosceles trapezoid structures which are sequentially connected with each other through lower surfaces thereof, each isosceles trapezoid structure includes an upper surface, the lower surface, and a third waist surface and a fourth waist surface oppositely arranged between the upper surface and the lower surface, and a length of the upper surface between the third waist surface and the fourth waist surface is less than a length of the lower surface between the third waist surface and the fourth waist surface;
in the case that the display panel is bent and in a bent portion of the display panel, the third waist surface of the isosceles trapezoid structure attaches to a fourth waist surface of the isosceles trapezoid structure adjacent thereto, and the upper surface of the isosceles trapezoid structure is connected with an upper surface of the isosceles trapezoid structure adjacent thereto;
the curvature adjuster is arranged above the gate driving circuit region on the two sides of the pixel region, the gate driving circuit region includes a plurality of gate driving circuit sub-regions, and each gate driving circuit sub-region includes a plurality of shift registers,
each of the isosceles trapezoid structures corresponds to one of the gate driving circuit sub-regions;
the isosceles trapezoid structure includes a conductive structure arranged in the isosceles trapezoid structure, a first end of the conductive structure is arranged on the third waist surface of the isosceles trapezoid structure, and a second end of the conductive structure is arranged on the fourth waist surface of the isosceles trapezoid structure,
in two adjacent isosceles trapezoid structures, in the case that the third waist surface of one isosceles trapezoid structure attaches to the fourth waist surface of the other isosceles trapezoid structure adjacent thereto, the first end of the conductive structure of the one isosceles trapezoid structure is electrically connected with the second end of the conductive structure of the other isosceles trapezoid structure,
a third end of the conductive structure is electrically connected with a signal input end of any one of the shift registers in the gate driving circuit sub-region covered by the isosceles trapezoid structure.

2. The flexible display panel according to claim 1, wherein, a curvature radius R of the flexible display panel in a bent state satisfies a relationship as follows:

$$a=\theta(R-h)/N, \ b=\theta R/N;$$

where, a is the length of the upper surface between the third waist surface and the fourth waist surface; b is the length of the lower surface between the third waist surface and the fourth waist surface; h is a height of the isosceles trapezoid structure; $\theta$ is a bending arc angle of all isosceles trapezoid structures located on an inner ring in the case that the flexible display panel is in the bent state, where $0<\theta\leq2\pi$; and N is a number of all isosceles trapezoid structures located on one side of the pixel region and located on the inner ring in the case that the flexible display panel is in the bent state, where $0<N\leq M$, and M is a number of all isosceles trapezoid structures provided on one side of the pixel region.

3. The flexible display panel according to claim 1, wherein,
at two ends or one end of the curvature adjuster, a shift register turn-off signal is input to the third end of the conductive structure of an outermost isosceles trapezoid structure in the case that the display panel is bent.

4. The flexible display panel according to claim 1, wherein, a same number of shift registers are provided between the shift registers connected with the third ends of the conductive structures of any two adjacent isosceles trapezoid structures.

5. The flexible display panel according to claim 1, wherein, the conductive structure includes a plate-shaped conductor or a pillar-shaped conductor provided between the first end and the second end, and the third end is electrically connected with the conductor provided between the first end and the second end.

6. The flexible display panel according to claim 1, wherein,
the first end of the conductive structure includes a convex structure or a concave structure, and the second end of the conductive structure includes a concave structure or a convex structure, and
in the case that two adjacent isosceles trapezoid structures attach to each other, a convex structure of a conductive structure of one isosceles trapezoid structure engages with the concave structure of the conductive structure of a other isosceles trapezoid structure.

7. The flexible display panel according to claim 3, further comprising: a switching transistor located outside the pixel region, wherein, one switching transistor is arranged for each shift register, a drain electrode of the switching transistor is connected with the shift register, a source electrode of the switching transistor is connected with a reset signal line, and a gate electrode of the switching transistor is connected with a gate signal line, and one reset signal line and one gate signal line are arranged for each switching transistor.

8. The flexible display panel according to claim 3, further comprising: a switching transistor located outside the pixel region, wherein, one switching transistor is arranged for each shift register, a drain electrode of the switching transistor is connected with the shift register, a source electrode of the switching transistor is connected with a reset signal line, and a gate electrode of the switching transistor is connected with a gate signal line; and along a scanning direction, a last shift register in a previous gate driving circuit sub-region and shift registers other than a last shift register in a next gate driving circuit sub-region are all connected with a same reset signal line and a same gate signal line, and the scanning direction is a direction in which the plurality of shift registers are turned on sequentially at the time of displaying a frame of image.

9. The flexible display panel according to claim 1, further comprising: a switching transistor located outside the pixel region, wherein, one switching transistor is arranged for each shift register, a drain electrode of the switching transistor is connected with the shift register, a source electrode of the switching transistor is connected with a reset signal line, and a gate electrode of the switching transistor is connected with a gate signal line; and one reset signal line and one gate signal line are arranged for one switching transistor.

10. A driving method of a flexible display panel, wherein the flexible display panel comprises a pixel region and a gate driving circuit region located outside the pixel region, the flexible display panel further comprises a curvature adjuster located on two sides of the pixel region, the curvature adjuster comprises a plurality of isosceles trapezoid structures which are sequentially connected with each other through lower surfaces thereof, each isosceles trapezoid structure includes an upper surface, the lower surface, and a third waist surface and a fourth waist surface oppositely arranged between the upper surface and the lower surface, and a length of the upper surface between the third waist surface and the fourth waist surface is less than a length of the lower surface between the third waist surface and the fourth waist surface, in the case that the display panel is bent and in a bent portion of the display panel, the third waist surface of the isosceles trapezoid structure attaches to a fourth waist surface of an isosceles trapezoid structure adjacent thereto, and the upper surface of the isosceles trapezoid structure is connected with an upper surface of the isosceles trapezoid structure adjacent thereto, the curvature adjuster is arranged above the gate driving circuit region on the two sides of the pixel region, the gate driving circuit region includes a plurality of gate driving circuit sub-regions, and each gate driving circuit sub-region includes a plurality of shift registers, each of the isosceles trapezoid structures corresponds to one of the gate driving circuit sub-regions, the isosceles trapezoid structure includes a conductive structure arranged in the isosceles trapezoid structure, a first end of the conductive structure is arranged on the third waist surface of the isosceles trapezoid structure, and a second end of the conductive structure is arranged on the fourth waist surface of the isosceles trapezoid structure, in two adjacent isosceles trapezoid structures, in the case that the third waist surface of one isosceles trapezoid structure attaches to the fourth waist surface of the other isosceles trapezoid structure adjacent thereto, the first end of the conductive structure of the one isosceles trapezoid structure is electrically connected with the second end of the conductive structure of the other isosceles trapezoid structure, a third end of the conductive structure is electrically connected with a signal input end of any one of the shift registers in the gate driving circuit sub-region covered by the isosceles trapezoid structure, and the method comprises: turning off the shift registers in the gate driving circuit sub-region in the case that the gate driving circuit sub-region is located in the bent portion of the display panel; and turning on the shift registers in the gate driving circuit sub-region in the case that the gate driving circuit sub-region is located in a flat portion of the display panel.

11. The flexible display panel according to claim 10, further comprising: at two ends or one end of the curvature adjuster, inputting a shift register turn-off signal to the third end of the conductive structure of an outermost isosceles trapezoid structure in the case that the display panel is bent.

12. The flexible display panel according to claim 10, wherein, the flexible display panel further comprises a switching transistor located outside the pixel region, one switching transistor is arranged for each shift register, a drain electrode of the switching transistor is connected with the shift register, a source electrode of the switching transistor is connected with a reset signal line, and a gate electrode of the switching transistor is connected with a gate signal line, one reset signal line and one gate signal line are arranged for one switching transistor, and the method further comprises: in the case that the gate driving circuit sub-region is located in the bent portion, inputting a turn-on signal to the switching transistors corresponding to the shift registers in the gate driving circuit sub-region by the gate signal lines, and inputting a reset signal transmitted on the reset signal lines to the shift registers by the switching transistors, so as to turn off the shift registers; and in the case that the gate driving circuit sub-region is located in the flat portion, inputting a turn-off signal to the switching transistors corresponding to the shift registers in the gate driving circuit sub-region by the gate signal lines, and being not able to input the reset signal transmitted on the reset signal lines to the shift registers, so that the shift registers work normally.

13. A display device, comprising the flexible display panel according to claim 1.

14. The flexible display panel according to claim 11, wherein, the flexible display panel further comprises a switching transistor located outside the pixel region, one switching transistor is arranged for each shift register, a drain electrode of the switching transistor is connected with the shift register, a source electrode of the switching transistor is connected with a reset signal line, and a gate electrode of the switching transistor is connected with a gate signal line, and one reset signal line and one gate signal line are arranged for each switching transistor.

15. The flexible display panel according to claim 11, wherein, the flexible display panel further comprises a switching transistor located outside the pixel region, one switching transistor is arranged for each shift register, a drain electrode of the switching transistor is connected with the shift register, a source electrode of the switching transistor is connected with a reset signal line, and a gate electrode of the switching transistor is connected with a gate signal line; and along a scanning direction, a last shift register in a previous gate driving circuit sub-region and other shift registers than a last shift register in a next gate driving circuit sub-region are all connected with a same reset signal line and a same gate signal line, and the scanning direction is a direction in which the plurality of shift registers are turned on sequentially at the time of displaying a frame of image.

16. A flexible display panel, comprising: a pixel region and a gate driving circuit region located outside the pixel region, wherein, the flexible display panel further comprises a curvature adjuster located on two sides of the pixel region, the curvature adjuster comprises a plurality of isosceles trapezoid structures which are sequentially connected with each other through lower surfaces thereof, each isosceles trapezoid structure includes an upper surface, the lower surface, and a third waist surface and a fourth waist surface oppositely arranged between the upper surface and the lower surface, and a length of the upper surface between the third waist surface and the fourth waist surface is less than a length of the lower surface between the third waist surface and the fourth waist surface;

in the case that the display panel is bent and in a bent portion of the display panel, the third waist surface of the isosceles trapezoid structure attaches to a fourth waist surface of an isosceles trapezoid structure adjacent thereto, and the upper surface of the isosceles trapezoid structure is connected with an upper surface of the isosceles trapezoid structure adjacent thereto;

the flexible display panel further comprises: a switching transistor located outside the pixel region;

the gate driving circuit region includes a plurality of shift registers, one switching transistor is arranged for each shift register, a drain electrode of the switching transistor is connected with the shift register, a source electrode of the switching transistor is connected with a reset signal line, and a gate electrode of the switching transistor is connected with a gate signal line; and one reset signal line and one gate signal line are arranged for one switching transistor.

* * * * *